Nov. 25, 1969 E. W. ROGERS ET AL 3,480,871

RADIO FREQUENCY AMPLIFIER WITH VARIABLE-GAIN STAGE FOR OVERLOAD PROTECTION

Filed Nov. 20, 1967 4 Sheets-Sheet 1

United States Patent Office 3,480,871
Patented Nov. 25, 1969

3,480,871

RADIO FREQUENCY AMPLIFIER WITH VARIABLE-GAIN STAGE FOR OVERLOAD PROTECTION

Ernest William Rogers, Burstow, Horley, Peter Dillon, Ifield, Crawley, and Christopher Richard Mitchell, Eastbourne, England, assignors to Redifon Limited, London, England, a British company Filed Nov. 20, 1967, Ser. No. 684,277
Claims priority, application Great Britain, Apr. 20, 1967, 18,205/67
Int. Cl. H03g 3/30, 5/16
U.S. Cl. 330—29 10 Claims

ABSTRACT OF THE DISCLOSURE

When tuning and loading a radio frequency amplifier, the amplifier load varies from a high impedance to a low resistance, so that peak voltage and power dissipation ratings are easily exceeded.

The invention comprises a radio frequency amplifier having a variable-gain stage and an output stage. A control voltage generating circuit monitors both the input D.C. current and the output voltage of the R.F. output stage. If either value exceeds a predetermined maximum, a control signal is supplied to the variable-gain stage to reduce its gain.

This invention relates to electric signal amplifiers and particularly to automatic power control and protection apparatus for such amplifiers.

In present day practice, it is customary to provide for correct loading of the output stage of a radio frequency amplifier by adjusting controls, which are associated with tuning and loading circuits of the output stage, so that the indication provided by a tuning indicator, by which the output current from the stage is measured, has a desired maximum value.

During the operation of tuning and loading, the phase angle of the load presented to the output stage of the amplifier varies, so that the load may have an impedance of a value which is very high or a resistance of a value which is very low.

Under these conditions, it is possible for critical ratings, such as the peak working voltage and the maximum power dissipation of amplifying devices of the amplifier, to be exceeded. Furthermore, optimum loading of the output stage may not be achieved without making repeated loading and tuning adjustments, if the critical ratings are not to be exceeded.

It is an object of the present invention to simplify the operation of tuning and loading the output circuit of an electric signal power amplifier.

It is a further object of the present invention to provide means for automatically controlling the amplitude of the signal applied to the input circuit of the power amplifier, so that critical ratings of an amplifying device or of amplifying devices of the output stage are not exceeded during the operation of tuning and loading of the output circuit of the amplifier or as a result of unwanted changes of load impedance.

Accordingly, the present invention provides, according to one aspect thereof, an electric signal amplifier including automatic control apparatus for controlling the power output of the amplifier, the amplifier having at least two amplifying stages connected in cascade, so as to provide an input stage and an output stage, the power output of the amplifier being determined by the gain of the input stage, the gain being controllable by a control signal applied thereto, the automatic control apparatus comprising first and second control signal generating means, the first control signal generating means providing an output voltage of a magnitude corresponding to the magnitude of a direct current supplied to the output stage of the amplifier, if the magnitude of the said direct current exceeds a predetermined value, the second control signal generating means providing an output voltage of a magnitude corresponding to the amplitude of the output voltage of the output stage of the amplifier, if the amplitude of the said output voltage exceeds a predetermined value, and comparison means for comparing the control signals provided by the first and second control signal generating means, the control signal for controlling the gain of the input stage being provided by the larger of the two control signals as selected by the comparison means, whereby the magnitude of the direct current fed to the output stage of the amplifier is prevented from exceeding a maximum permissible value, and/or the amplitude of the output voltage of the amplifier is prevented from exceeding a maximum permissible value and the maximum power output of the amplifier, for a given load impedance, has an optimum value.

According to a second aspect thereof, the present invention provides an electric signal amplifier including automatic control apparatus for controlling the power output of the amplifier, the amplifier having at least three amplifying stages connected in cascade so as to provide an input stage, an intermediate stage and an output stage, the power output of the amplifier being determined by the gain of the input stage and the gain of the intermediate stage, the gains of the input and intermediate stages being controllable by control signals applied thereto, the automatic control apparatus comprising first and second control signal generating means, the first control signal generating means providing an output voltage of a magnitude corresponding to the magnitude of the direct current supplied to the output stage of the amplifier, if the magnitude of the said direct current exceeds a predetermined value, the second control signal generating means providing an output voltage of a magnitude corresponding to the amplitude of the output voltage of the output stage of the amplifier, if the amplitude of the said output voltage exceeds a predetermined value, the control signal for controlling the gain of the input stage of the amplifier being provided by the output voltage of one control signal generating means and the control signal for controlling the gain of the intermediate stage of the amplifier being provided by the output voltage of the other control signal generating means, whereby the magnitude of the direct current fed to the output stage of the amplifier is prevented from exceeding a maximum permissible value, and/or the amplitude of the output voltage is prevented from exceeding a maximum permissible value, and the maximum power output of the amplifier, for a given load impedance, has an optimum value.

The present invention also provides automatic control apparatus, for association with an electric signal amplifier and for controlling the power output of the amplifier, for the purpose aforesaid.

In order that the invention may be more readily carried into effect, an embodiment thereof will now be described in detail, by way of example, with reference to the accompanying drawings, in which.

Figure 1:
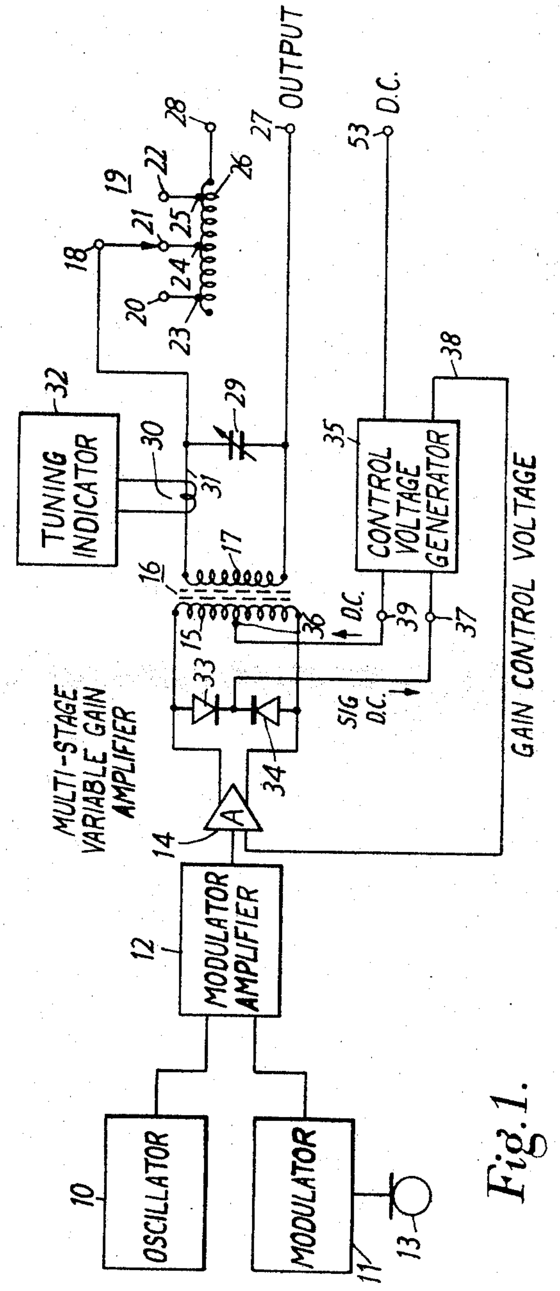
FIGURE 1 is a block diagram of a radio transmitter incorporating a control circuit according to the present invention.

Referring to FIGURE 1, an oscillator 10, a modulator 11 and a modulated amplifier 12 are units of a conventional generator of single sideband radio frequency signals, providing an output signal which may be set to any frequency within the range of 2 to 12 megacycles per second. The modulator is fed with speech signals received by way of a microphone 13. The signal from the modulated amplifier 12 is fed to a multi-stage radio frequency amplifier 14, the gain of which is varied according to the level of a direct control voltage which is applied to an electrode of an amplifying device contained therein by way of line 38.

The output circuit of the amplifier is such that a radio frequency signal, which is symmetrical with respect to chassis, is fed to a primary winding 15 of a wideband output transformer 16. One end of a secondary winding 17 is joined to a wiper arm 18, of a three position switch 19, having three contacts 20, 21 and 22. The contacts 20, 21 and 22 are joined to taps 23, 24 and 25 respectively of an inductor 26, the taps providing a convenient means of selecting different values of inductance. The other end of the secondary winding 17 is joined to an output terminal 27. One end of the winding of the inductor 26 is joined to an output terminal 28 and a variable capacitor 29 is connected between the wiper arm 18 of the switch 19 and the output terminal 27. The elements 19, 26 and 29 provide a network whereby an external load, not shown in the drawing, connected between terminals 27 and 28 may be tuned to match the output impedance of the output stage of the amplifier 14. For example, the load may be provided by a whip antenna connected to the terminal 28, with a ground mat or radial wires connected to the terminal 27. Such an antenna is normally operated at frequencies at which it is equivalent to a resistor and a capacitor connected in series, having a value of resistance between 5 and 50 ohms and a value of capacitance between 20 picofarads and infinity.

A current transformer 30, comprising a secondary winding wound on a ferrite core of toroidal form is arranged so that a lead 31 connecting the secondary winding 17 of the output transformer 16 to the wiper arm 18 of the switch 19 and to the variable capacitor 29, is embraced by the core. The secondary winding of the transformer 30 is connected to a tuning indicator device 32, comprising a diode rectifier, a capacitor, a resistor and an indicating instrument, by which a deflection is provided which is proportional to the level of the signal current flowing through the connecting lead 31.

Two diodes 33 and 34 are connected across the primary winding 15 of the output transformer 16 so as to provide a full wave rectifying circuit. A rectified direct current signal, proportional to the peak value of the radio frequency voltage across the primary winding 15, is fed to an input terminal 37 of a control voltage generator 35. Direct current for feeding to the output stage of the amplifier 14 is provided from a source of supply, not shown, connected to a terminal 53, by way of a control voltage generator 35. This direct current, which is provided from an output terminal 39 of the control voltage generator 35, is fed to the centre tap 36 of the output transformer 16.

In the control voltage generator, a control voltage for controlling the gain of the amplifier 14, is derived from the direct current fed to the output stage of the amplifier 14 and from the rectified signal voltage fed to the input terminal 37.

The control voltage is applied to the amplifier 14 in a sense to reduce gain with increasing power output, so that the current fed to the amplifier output stage is prevented from exceeding a maximum permissible value and/or the amplitude of the output voltage is prevented from exceeding a maximum permissible value and so that the maximum power output of the amplifier, for a given load impedance, has an optimum value. The control voltage generator 35 will be described in detail later in the specification.

Although semiconductor devices are shown in the apparatus to be described later in detail, it will be appreciated that the invention is applicable to circuits employing thermionic valves.

The radio frequency amplifier 14 will now be described in detail with reference to FIGURE 2. In the drawing, the output transformer 16, the primary and secondary windings 15 and 17, the centre tap 36, the rectifying diodes 33 and 34 and the terminals 37 and 39 of the control voltage generator 35 are indicated by the same reference numbers as in FIGURE 1.

A single sideband signal from the modulated amplifier 12, FIGURE 1, is fed to input terminals 42 and 43 of the amplifier. Terminal 42 is connected to the base electrode of a transistor 40, of n-p-n type, by way of a direct current isolating capacitor 41. Terminal 43 is connected to the chassis of the amplifier.

The transistor 40 is connected in a circuit arrangement to provide a variable gain amplifying stage. A control voltage and a bias voltage are fed to the base electrode of the transistor, from terminals 46 and 48 respectively, by way of diodes 47 and 49 respectively and a radio frequency choke 44. A capacitor 45 is connected from the junction of the choke 44 and the diodes 47 and 49, indicated in the drawing by the reference number 78, and to the chassis, so that unwanted radio frequency currents are by-passed to chassis.

Terminals 48 and 43 are connected to a source of supply of direct current, not shown in the drawing, of positive and negative polarity respectively. The control voltage, of variable magnitude and of positive polarity, provided by the control voltage generator 35, FIGURE 1, to be described in detail later in the specification, is fed to the terminal 46. The diode 47 is connected in a sense to be conductive to the control voltage of positive polarity applied to terminal 46. The bias voltage is set to a level so that the working conditions of the transistor 40 are such that maximum desired amplification of the input signal is provided. The diode 49 is connected in a sense to be conductive to the bias voltage of positive polarity from the terminal 48 of the source of supply. The amplification of the transistor 40 is reduced correspondingly when the level of the control voltage exceeds that of the bias voltage. The diodes 47 and 49 also function as isolating diodes, so that either one of two sources of voltage is prevented from loading the other of the two sources.

As emitter biasing resistor 50 and a radio frequency by-passing capacitor 51 are connected between the emitter electrode of the transistor 40 and chassis. The collector electrode of the transistor 40 is supplied with current by way of a radio frequency choke 52 which is connected to a terminal 53 of a source of supply of direct current, not shown in the drawing, the positive and negative poles of which are joined to the terminal 53 and to chassis respectively. The source of supply is designed so that negligible impedance is presented to alternating currents of the signal frequency of the amplifier. A capacitor 54 is connected between terminal 53 and chassis, so that unwanted radio frequency currents are by-passed to chassis.

The output signal from the collector electrode of the transisor 40 is fed by way of a direct current isolating capacitor 55 to a primary winding 56 of a wide-band input transformer 57. A secondary winding 58 of the input transformer 57 provides a push-pull signal output with respect to a centre tap 59 of the secondary winding. The ends of the secondary winding are connected to the base electrodes of transistors 60 and 61 respectively of a pair of transistors forming the push-pull driver stage of the amplifier 14. The transistors 60 and 61 are of n-p-n type and are connected in an emitter-follower configuration.

A bias voltage, of positive polarity with respect to chassis, is provided for the transistors 60 and 61 by a potentiometer network comprising two series connected resistors 62 and 63, to which the centre tap 59 of the secondary winding 58 is connected. The resistors 62 and 63 are connected to terminals 53 and 43 respectively of the source of supply of direct current. The resistors are of a value such that the transistors 60 and 61 are operated under class A conditions.

The collector electrodes of the transistors 60 and 61 are connected to decoupling resistors 64 and 65 respectively which are also connected to terminal 53 of the source of supply of direct current. Unwanted radio and audio frequency currents are by-passed to chassis by capacitors 66 and 67, connected respectively to the collector electrodes of the transistors 60 and 61. The emitter electrodes of the transistors 60 and 61 are connected to resistors 68 and 69 respectively which are also connected to chassis.

The emitter electrode of the transistor 60 is directly connected to the base electrode of a transistor 70 of a pair of transistors 70 and 71, which form a push-pull output stage of the amplifier. The emitter electrode of the transistor 61 is directly connected to the base electrode of the transistor 71. The transistors 70 and 71 are of n-p-n type and are connected in a common emitter configuration.

The resistors 68 and 69 provide a conductive path for the emitter currents of the transistors 60 and 61 and bias voltages for the transistors 70 and 71. The resistors 68 and 69 are of a value such that the transistors 70 and 71 operate under class B conditions.

The emitter electrodes of the transistors 70 and 71 are connected to resistors 72 and 73 respectively, which are also connected to chassis. The collector electrodes of the transistors 70 and 71 are connected to the ends of the primary winding 15 of the push-pull transformer 16.

Direct current of positive polarity is fed to the collector electrodes of the transistors 70 and 71 by way of the centre tap 36 of the primary winding 15, from the terminal 39 of the control voltage generator 35 FIGURE 1. Unwanted radio frequency currents are by-passed to chassis by a capacitor 74, connected between the centre tap 36 and the chassis.

The rectifying diodes 33 and 34 are connected in series and in opposite sense between the collector electrodes of the transistors 70 and 71. The junction point of the two diodes is connected to terminal 37 of the control voltage generator so that a rectified voltage of negative polarity, which is proportional to the peak value of the radio frequency voltage between the collector electrodes of the transistors 70 and 71, is fed thereto.

The secondary winding 17 of the output transformer 16 is connected to output terminals 75 and 76. Power is supplied from these terminals by way of the impedance matching network provided by the inductor 26, and the variable capacitor 29, FIGURE 1, to an antenna, as already described earlier in the specification.

The control voltage generator 35, FIGURE 1, will now be described in detail, with reference to FIGURE 3. In the drawing, parts of the apparatus described with reference to FIGURES 1 and 2 are shown bearing the same reference numbers as in FIGURES 1 and 2.

Figure 2:
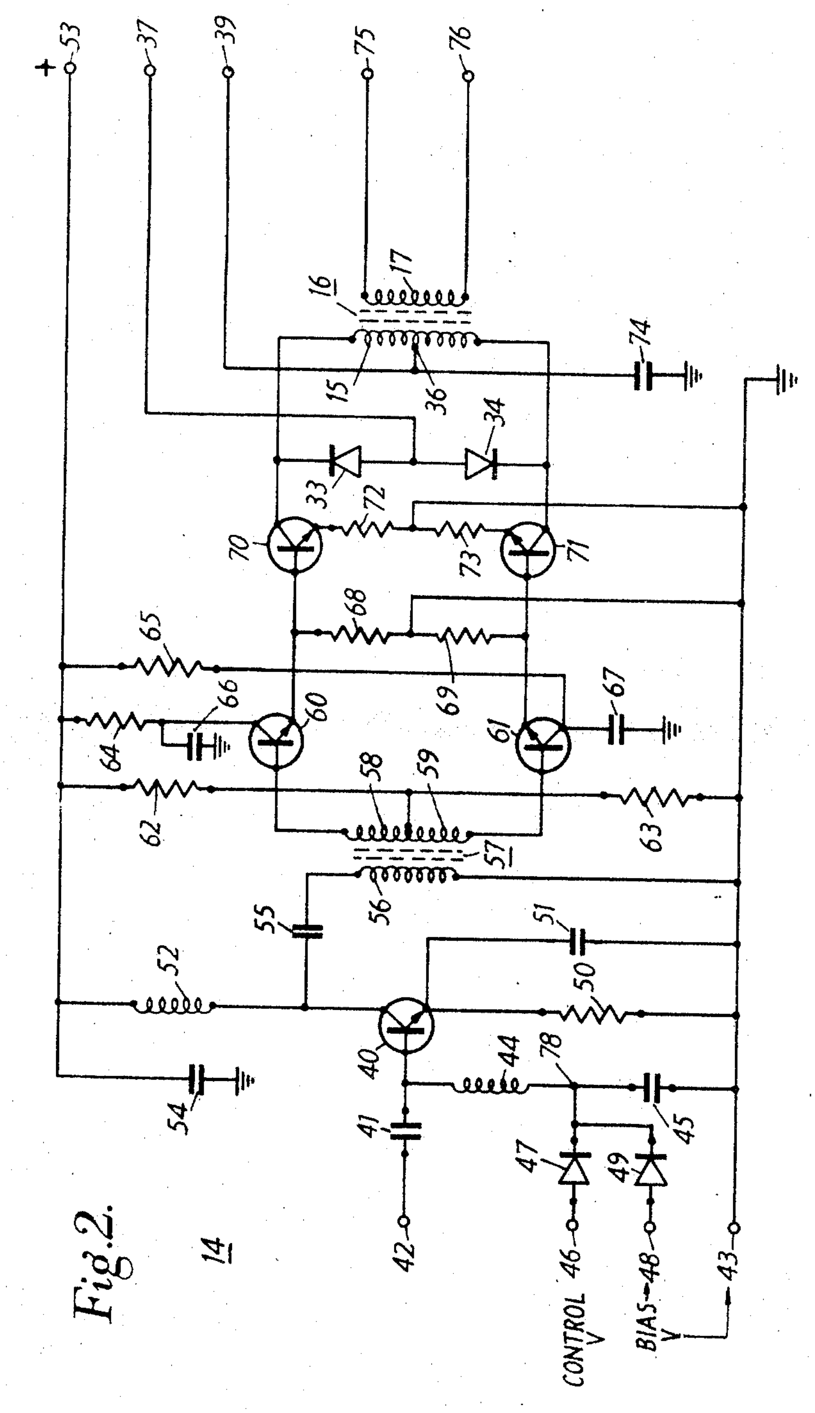
FIGURE 2 is a schematic diagram of a radio frequency amplifier, forming part of the transmitter of FIGURE 1.

The amplified radio frequency signal from the emitter electrodes of the transistors 60 and 61, FIGURE 2, is fed by way of terminals 80 and 81 to the base electrodes of the transistors 70 and 71 respectively. The terminal 39 is connected by way of a resistor 82 to the terminal 53 of the source of supply of direct current. The direct current flowing to the collector electrodes of the transistors 70 and 71 by way of resistor 82, produces a drop in voltage across the resistor 82. Hence, a positive voltage with respect to chassis is provided at the terminal 39 which decreases and increases in value as the current fed to the collector electrodes increases and decreases respectively. Across the resistor 82 is connected the winding of a potentiometer 83 and a resistor 84. The winding of the potentiometer 83 and the resistor 84 are connected in series and have a combined value of resistance which is high with respect to that of the resistor 82. The potentiometer 83 has a wiper 85 which is connected to the base electrode of a transistor 86. The transistor 86 is of p-n-p type and is connected in a circuit arrangement to function as a direct current amplifier.

For this purpose, a bias resistor 87 is connected between the emitter electrode of the transistor 86 and the terminal 53 of the source of supply and the collector electrode of the transistor is connected to a load resistor 88, which is also connected to the chassis.

The magnitude of the current flowing through the resistor 82 determines the magnitude of the voltage applied to the base electrode of the transistor 86. As the magnitude of this current increases, the emitter electrode to base electrode voltage becomes increasingly positive and the collector current of the transistor increases in an approximately linear manner, when this voltage is greater than the barrier potential of the emitter to base junction of the transistor. The control voltage is derived from the voltage developed across the collector resistor 88. The position of the wiper 85 of the potentiometer 83 is preset to provide the desired amount of control.

The amplified radio frequency signal voltage between the collector electrodes of the transistors 70 and 71 is applied to the diodes 33 and 34 and a rectified voltage of negative polarity is fed by way of a resistor 89 to a storage capacitor 90 which is also connected to chassis. The resistor 89 is provided in order to raise the impedance of the rectifying circuit, so that there is negligible distortion of the radio frequency signal voltage due to the rectifying action of the diodes.

A Zener diode 91 is connected from the capacitor 90 to the base electrode of a transistor 92. The transistor 92 is of p-n-p type and is connected in a circuit arrangement to function as a direct current amplifier. For this purpose, the emitter electrode of the transistor 92 is connected to a source of supply of direct current of variable voltage provided by a potentiometer network comprising a variable resistor 94 and resistors 95 and 96 of fixed value. The collector electrode is connected to a resistor 97, which is also connected to chassis.

The rectified voltage of negative polarity provided across the capacitor 90 is applied to the base electrode of the transistor 92 by way of the Zener diode 91. When this voltage is greater than the breakdown voltage of the Zener diode, the magnitude of the voltage applied to the base electrode of the transistor 92 is approximately proportional to the amplitude of the radio frequency voltage applied to the diodes 33 and 34. A conductive path for the base current of the transistor 92 is provided by a resistor 93 connected between the base electrode of the transistor 92 and the terminal 39. The gain of the amplifying circuit of the transistor 92 is adjusted to a desired value by the variable resistor 94. The variable resistor 94 and the resistor 95, by which the minimum value of the available gain is determined, are connected in series and between the emitter electrode of the transistor 92 and the terminal 39.

The voltage applied to the emitter resistor 95 and to the base resistor 93 of the transistor 92 is provided from the terminal 39. Hence, variations of voltage between terminal 37 and chassis, due to variations of the collector currents of the transistors 70 and 71, are followed by corresponding changes of voltage across the transistor 92 and the voltage developed across the collector resistor 97 is substantially independent of the collector currents of the transistors 70 and 71.

Thus, the voltage across the collector resistor 88 of the transistor 86 is of a magnitude corresponding to the magnitude of the current supplied to the collector electrodes of the transistors 70 and 71, if the magnitude of the input voltage fed to the base electrode of the transistor 86 exceeds a predetermined value as determined by the setting of the potentiometer 85. Furthermore, the voltage across the collector resistor 97 of the transistor 92 is of a magnitude corresponding to the ampltiude of the voltage between the collector electrodes of the transistors 70 and 71, if the magnitude of the input voltage fed to the base electrodes of the transistor 92 exceeds a predetermined value, determined by the breakdown voltage of the Zener diode 91. The two voltages across the resistors 88 and 97 are fed to comparison means provided by two diodes 98 and 99. The diodes are connected back to back between the emitter electrodes of the transistors 86 and 92 and the junction between the two diodes is connected to the base electrode of a transistor 100. In this arrangement, a diode is conductive to the larger of the two voltages, of positive polarity with respect to chassis, across the collector resistors of the transistors 86 and 92. When the two voltages are of the same level, both diodes are conductive and the common level of voltage is fed to the base electrode of the transistor 100. The transistor 100 is coupled to a transistor 101, both transistors being of n-p-n type and connected in a grounded collector configuration to provide a two stage direct current amplifier. A conductive path for the input circuit of the transistor 100 is provided by a resistor 102, connected between the base electrode of the transistor and the chassis. A storage capacitor 103 and an emitter resistor 104 are connected between the emitter electrode of the transistor 100 and chassis. The emitter electrode of the transistor 100 is directly connected to the base electrode of the transistor 101. The value of the capacitor 103 is chosen to provide, in combination with the value of the resistor 104, a time constant such that changes in the level of the voltage, which would be produced when speech signals are fed to the modulator 11. In FIGURE 1, are smoothed out. A resistor 105 is connected between the emitter electrode of the transistor 101 and the chassis.

The collector electrodes of the transistors 100 and 101 are joined together and connected to a terminal 106 of a source of supply of direct current, not shown in the drawing, the positive and negative poles of which are connected to the terminal 106 and the terminal 43 respectively.

The voltage, of positive polarity with respect to chassis, produced across the emitter resistor 105 of the transistor 101, is fed to a terminal 109 and from thence to the input terminal 46, of the amplifier 14, FIGURE 2, as a control voltage, to reduce the gain of the variable gain amplifier stage of the amplifier.

The manner in which the preset controls are adjusted will now be described. Referring to FIGURE 3, a resistive load having a low value of resistance of approximately 5 ohms is connected across the output terminals 76 and 77, so that the amplitude of the signal voltage developed across the output terminals may be of a relatively low value. The wiper 85 of the potentiometer 83 is set to a position so that the input voltage fed to the base electrode of the transistor 86 is a minimum. The level of a 1,000 c.p.s. modulated signal, fed from the modulated amplifier 12, FIGURE 1, to the input terminal 42, FIGURE 2, is increased from zero until the current flowing to the collector electrodes of the transistors 70 and 71 is approximately 5 percent below the maximum permissible value, according to the manufacturer's rating. The values of the potentiometer 83, and of the resistors 84 and 87 are such that, under the conditions just described, the voltage applied to the transistor 86 is greater than the barrier potential of the emitter to base junction of the transistor and the magnitude of the control voltage fed to the input terminal 46 is approximately 80 percent of the value of the bias voltage fed to the input terminal 48. The input of the preset potentiometer 83 is then adjusted to a position where the control voltage applied to the input terminal 46 reduces the output current to the load by approximately 5 percent.

A resistive load having a high value of resistance of approximately 500 ohms is substituted for the low resistance load, so that the magnitude of the current fed to the collector electrodes of the transistor 70 and 71 may be of a relatively low value. The wiper of the variable resistor 94 is set to a position to provide maximum resistance. The level of the 1,000 c.p.s. modulated signal, fed from the modulated amplifier 12, FIGURE 1, to the input terminal 42, FIGURE 2, is increased from zero until the value of the peak voltage between the collector electrodes of the transistors 70 and 71 is approximately 10 percent below the maximum permissible value, according to the manufacturer's rating. The Zener diode 91 is chosen so that, under the conditions just described, the breakdown voltage is exceeded by the rectified voltage produced across the capacitor 90 and the magnitude of the control voltage fed to the input terminal 46 is approximately 80 percent of the value of the bias voltage fed to the input terminal 48. The variable resistor 94 is then adjusted to a position where the control voltage applied to the input terminal 46 reduces the output voltage across the load by approximately 4 percent.

In a transmitter of the kind described with reference to FIGURE 2, incorporating the control circuit described in detail with reference to FIGURE 3, the output circuit of the class B radio frequency amplifier may be tuned and loaded so that optimum output power is provided for a given load impedance without the necessity for the level of the signal fed to the input of the stage to be repeatedly adjusted. During the tuning and loading operation, changes in the direct current fed to the output stage and in the output voltage produced by the output stage, do not exceed two decibels, hence damage to the transistors 70 and 71 of the output stage is avoided.

In an alternative arrangement, the transmitter circuit of FIGURE 2, is provided with first and second variable gain amplifying stages and control voltages are separately fed to the two stages to control the gain. For this purpose, the comparison means of FIGURE 3 is dispensed with and voltages from points 107 and 108 are separately amplified and fed to the control electrodes of the first and second variable gain stages, each of the amplifiers being similar to the amplifier provided by the transistors 100 and 101 and their associated circuit elements.

Figure 4:
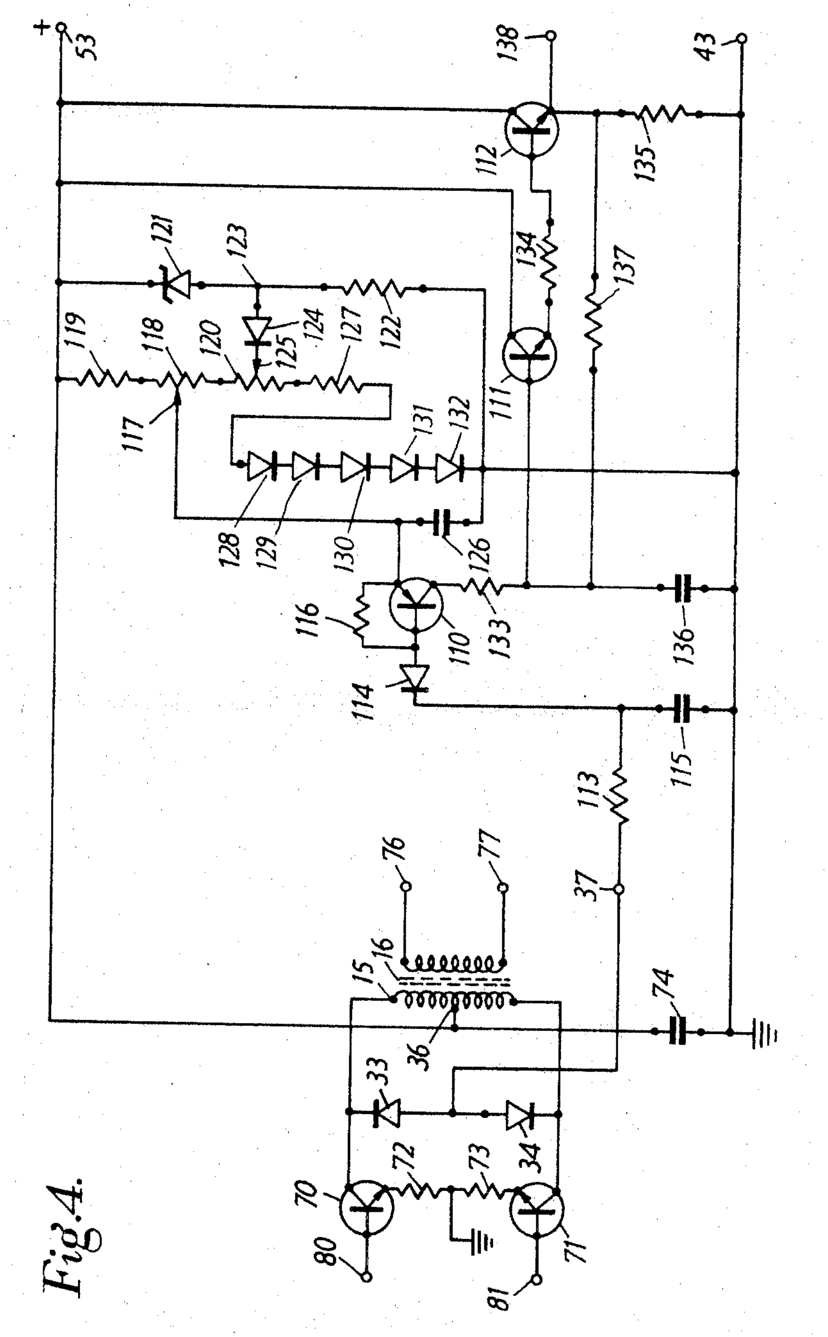
FIGURE 4 is a schematic diagram of an alternative form of the control circuit.

A form of signal voltage control circuit suitable for use in amplifying apparatus in which substantial variations may occur in the voltage of the source of supply of direct current, for example of up to ±15%, is shown in FIG. 4. Using the circuit arrangement of FIG. 4, the amplitude of the radio frequency voltage between the collector electrodes of the output circuit transistors is maintained at a substantially constant maximum permissible value for voltage values of the source of supply which are in excess of the nominal value. If the voltage of the source of supply has a value which is less than the nominal value, the amplitude of the input radio frequency signal to the amplifier is reduced, so that excessive distortion of the output signal is avoided.

In FIG. 4, parts of the apparatus described with reference to FIGS. 1 and 2 are indicated by the same reference numbers as in FIGS. 1 and 2. A rectified direct current signal, proportional to the peak value of the radio frequency voltage across the primary winding 15 of the transformer 16, is fed to the input terminal 37 of a control signal generator comprising a transistor 110 of p-n-p-type, transistors 111 and 112 of n-p-n type, and associated electrical components. The rectified voltage, of negative polarity with respect to the polarity of the terminal 53, is fed by way of a resistor 113 and a diode 114 to the base electrode of the transistor 110. A storage capacitor 115 is connected between the junction of the resistor 113 and one electrode of the diode 114 and the chassis. The resistor 113 is provided in order to raise the impedance of the rectifying circuit, so that distortion of the radio frequency signal may be avoided. A resistor 116 is connected between the base and emitter electrodes of the transistor 110, and has a high value, so that normal operation of the transistor 110 is unaffected. The resistor 116 is provided to establish the potential of the base electrode at a desired value with respect to that of the positive polarity terminal 53 of the source of supply of direct current and to maintain the reverse voltage across the emitter/base junction of the transistor 110 at a low value, so that breakdown of the junction is prevented. The diode 114 is of a type which is capable of withstanding the full value of the reverse voltage. The emitter electrode of the transistor 110 is connected to the wiper 117 of a pre-set potentiometer 118, the winding of which is connected by way of a resistor 119 to the positive polarity terminal 53 of the source of supply of direct current and to the winding of a pre-set potentiometer 120.

The negative electrode of a Zener diode 121 is connected to the terminal 53 of the source of supply and the positive electrode is connected by way of a resistor 122 to the chassis. The junction point 123 between the Zener diode 121 and the resistor 122 is connected by way of a diode 124 to wiper 125 of the pre-set potentiometer 120. A capacitor 126 is connected between the emitter electrode of the transistor 110 and the chassis.

In this example, using a source of supply of direct current of 24 volts, the value of the resistor 122 is chosen so that the minimum value of the current flowing through the Zener diode 121 provides a D.C. voltage of negative polarity of 9 volts with respect to the positive polarity terminal 53 of the source of supply of direct current, at the junction point 123.

The resistor 119, the windings of the pre-set potentiometers 118 and 120, a resistor 127 and five diodes 128, 129, 130, 131 and 132 are connected in series between the terminals 53 and 43 of the source of supply of direct current to form a potential divider network. The wiper 125 of the pre-set potentiometer 120 is adjusted so that the diode 124 starts to conduct when the voltage of the source of supply of direct current connected to the terminals 53 and 43 is of a normal value, in this example, 24 volts. The bias voltage of the emitter electrode of the transistor 110 is pre-set by adjustment of the wiper 117 of the potentiometer 118, to a value such that the transistor 110 becomes conductive if the amplitude of the radio frequency voltage between the collector electrode of either transistor 70 or transistor 71 and the centre tap 36 of the transformer 16, exceeds the maximum permissible voltage rating of the transistors.

Current from the collector electrode of the transistor 110 is returned to chassis by way of a resistor 133, the base to emitter junction of the transistor 111, a resistor 134, the base to emitter junction of the transistor 112, and a resistor 135. The transistors 111 and 112, of n-p-n type, are directly connected by the resistor 134 to form a two stage D.C. amplifier. The resistors 133 and 134 limit the magnitude of the direct current flowing through the base/emitter junctions of the transistors 111 and 112 to a desired value. The collector electrodes of the transistors 111 and 112 are directly connected to the positive polarity terminal 53 of the source of supply.

A storage capacitor 136 is connected between the base electrode of the transistor 111 and the chassis. The resistor 137, is connected between the base electrode of the transistor 111 and the emitter electrode of the transistor 112. The value of resistor 137 is chosen so that the desired operating conditions are provided for the transistors. The values of the capacitors 126 and 136 are chosen in relation to the values of the resistors of the circuit, so that the time constants of the emitter and collector circuits of the transistor 110 have such values that any appreciable variations in amplitude of the signal applied to the base electrode of the transistor 111, at modulation frequencies, are smoothed out.

A control voltage, of positive polarity, with respect to the chassis, is provided from the emitter electrode of the transistor 112 and is fed to an output terminal 138. A substantially constant voltage is maintained at the junction point 123 by the stabilizing action of the Zener diode 121, in spite of any increase in the voltage of the source of supply of direct current. Hence, the bias voltage at the emitter electrode of the transistor 110 is also maintained at a constant value and the amplitude of the radio frequency signal output is controlled to have a substantially constant maximum permissible value.

If the magnitude of the voltage of the source of the supply of direct current decreases, the maximum level of the radio frequency voltage between the collector electrodes of the transistors 70 and 71 has to be reduced to a greater extent, in order to avoid excessive distortion due to non-linear operation of the transistors. When the Zener diode 121 ceases to conduct, conduction through the diode 124 also ceases and the potential fed to the emitter electrode of the transistor 110 is obtained by way of the potential divider comprising the resistor 119, the windings of the potentiometers 118 and 120, the resistor 127 and the diodes 128 to 132. The diodes 128 to 132 are conductive, therefore the voltage across them tends to remain substantially constant so that the decrease in the voltage between the wiper 117 of the potentiometer 118 and the chassis is reduced. Hence, the percentage decrease in the bias voltage between the wiper 117 of the potentiometer 118 and the terminal 53 is greater than the percentage decrease in the voltage of the source of supply.

In the arrangement of FIG. 4, using the five diodes 128 to 132, a 15% decrease in the voltage of the source of supply of direct current produces a decrease of approximately 18% in the biasing voltage applied to the emitter electrode of the transistor 110. The number of diodes used may be increased with a corresponding change in the value of the resistor 127, to provide a greater percentage decrease in the value of the bias voltage in relation to the decrease in the voltage of the source of supply.

The voltage from the terminal 138, of positive polarity with respect to chassis, is fed to the input terminal 46 of the amplifier 14, FIG. 2, to provide a control voltage for controlling the gain of the amplifier, so that the desired maximum permissible level of the output signal voltage is maintained.

The control voltage derived from the rectified peak radio frequency voltage between the collector electrodes of the transistors 70 and 71, provided by the circuit arrangement of FIGURE 4, and a control voltage derived from the direct current flowing to the emitter/base junctions of the transistors 70 and 71, may be combined, using a circuit arrangement similar to that described with reference to FIG. 3.

Figure 3:
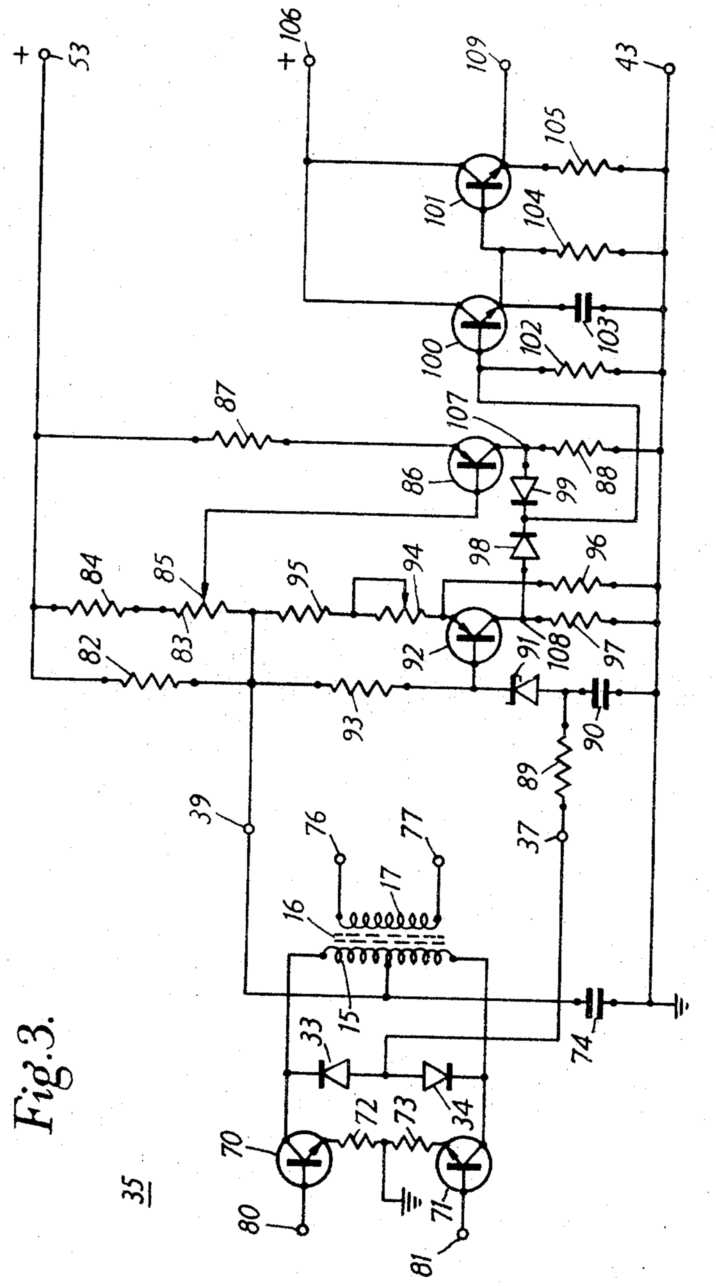
FIGURE 3 is a schematic diagram of the control circuit of FIGURE 1.

For this purpose, the transistor 92, the resistors 82, 93 and 97, the Zener diode 91 and the capacitor 90 are omitted from the circuit of FIG. 3. The diode 98 of the comparison diodes 98 and 99 is connected to the terminal 138. The control voltage is provided from the emitter electrode of the transistor 101, FIG. 3 and is fed from the terminal 109 to the input terminal 46 of the amplifier 14, FIG. 2.

What we claim is:

1. An electric signal amplifier including automatic control apparatus for controlling the power output of the amplifier, the amplifier having at least two amplifying stages connected in cascade, so as to provide an input stage and an output stage, the power output of the amplifier being determined by the gain of the input stage, the gain being controllable by a control signal applied thereto, the automatic control apparatus comprising first and second control signal generating means, the first control signal generating means providing an output voltage of a magnitude corresponding to the magnitude of a direct current supplied to the output stage of the amplifier, if the magnitude of the said direct current exceeds a predetermined value, the second control signal generating means providing an output voltage of a magnitude corresponding to the amplitude of the output voltage of the output stage of the amplifier, if the amplitude of the said output voltage exceeds a predetermined value, and comparison means for comparing the control signals provided by the first and second control signal generating means, the control signal for controlling the gain of the input stage being provided by the larger of the two control signals as selected by the comparison means, whereby the magnitude of the direct current fed to the output stage of the amplifier is prevented from exceeding a maximum permissible value, and/or the amplitude of the output voltage of the amplifier is prevented from exceeding a maximum permissible value and the maximum power output of the amplifier, for a given load impedance, has an optimum value.

2. An electric signal amplifier as claimed in claim 1, in which said input stage of the amplifier comprises a transistor amplifier having a bias voltage and the said control signal applied to the base electrode thereof, whereby the gain of said input stage is reduced when the control signal voltage exceeds the bias voltage.

3. An electric signal amplifier as claimed in claim 2, in which the output signal from said input stage is fed to a push-pull amplifier.

4. An electric signal amplifier as claimed in claim 1, in which the push-pull amplifier is the said output stage and comprises a pair of class B operating transistor amplifiers, each with a class A operating, emitter-follower driver transistor.

5. An electric signal amplifier as claimed in claim 4, in which said output voltage of the output stage of the amplifier is determined by a rectified voltage derived from a rectifier connected between the output electrodes of said pair of class B amplifiers.

6. An electric signal amplifier as claimed in claim 1, in which the automatic control apparatus includes a voltage dropping resistor, which is connected in series with a source of current supply and the said output amplifier stage, and a direct current amplifier controlled by the voltage across said series resistor and said first control voltage is developed across a resistor in series with said direct current amplifier.

7. An electric signal amplifier as claimed in claim 6, in which the rectified voltage is supplied to a series resistor and storage capacitor circuit and is applied to a transistor direct current amplifier by way of a Zener diode.

8. An electric signal amplifier as claimed in claim 7, in which said voltage dropping resistor, a further resistor, said Zener diode and said storage capacitor form a series-connected combination between said source of current supply and the chassis of said ampliler and said automatic control apparatus.

9. An electric signal amplifier as claimed in claim 8, in which a load resistor is connected in series with said direct current amplifier and in which the voltage across said voltage dropping resistor is supplied to a further transistor amplifier having a further load resistor, the voltages across said load resistor and said further load resistor being compared by way of a pair of diodes, connected back to back, for selection of the larger.

10. An electric signal amplifier as claimed in claim 9, in which the selected voltage is supplied to further amplifiers, including a resistor/capacitor network, having a time constant long enough to smooth signals at audio frequencies, and the output voltage is supplied as a gain control signal to at least the input stage of the amplifier.

References Cited

UNITED STATES PATENTS 2,248,783 7/1941 Rinia et al. -------- 330—138 X

ROY LAKE, Primary Examiner

J. B. MULLINS, Assistant Examiner

U.S. Cl. X.R.

330—133, 134, 138, 139